United States Patent [19]

Maekawa et al.

[11] Patent Number: 5,972,069
[45] Date of Patent: Oct. 26, 1999

[54] METALLIC MATERIAL MADE FROM TUNGSTEN OR MOLYBDENUM, METHOD OF PRODUCING THE METALLIC MATERIAL, AND SECONDARY PRODUCT MATERIAL USING THE METALLIC MATERIAL

[75] Inventors: Shigeki Maekawa; Megumi Takemoto, both of Tokyo, Japan

[73] Assignee: Mitsubishi Denki Kabushiki Kaisha, Tokyo, Japan

[21] Appl. No.: 09/120,367

[22] Filed: Jul. 22, 1998

[30] Foreign Application Priority Data

Jul. 24, 1997 [JP] Japan .................................. 9-198535
Feb. 17, 1998 [JP] Japan ................................ 10-034874

[51] Int. Cl.$^6$ ...................................................... C22C 1/09
[52] U.S. Cl. .................................. 75/248; 419/3; 419/4; 419/28; 419/29
[58] Field of Search .................................. 419/28, 29, 3, 419/4; 75/248

[56] References Cited

U.S. PATENT DOCUMENTS

| 3,802,851 | 4/1974 | Dunham . | |
|---|---|---|---|
| 4,514,234 | 4/1985 | Fukasawa et al. . | |
| 4,923,673 | 5/1990 | Litty | 419/20 |
| 5,087,299 | 2/1992 | Fukuchi et al. . | |
| 5,145,512 | 9/1992 | Spencer et al. | 75/248 |
| 5,440,995 | 8/1995 | Levitt | 102/517 |
| 5,742,891 | 4/1998 | Patrician et al. | 419/4 |

FOREIGN PATENT DOCUMENTS 5-140613  6/1993  Japan .

*Primary Examiner*—Ngoclan Mai
*Attorney, Agent, or Firm*—Burns, Doane, Swecker & Mathis, LLP

[57] ABSTRACT

A primary product comprising tungsten or molybdenum accommodated in a container 1 is heated at 500° C. with 1000 atmospheric pressure in an Ar gas atmosphere and retained for 1 hour. According to the present invention, the crystal orientation in the (110) face can be 99% or more, and thus a material with a good electron radiation characteristic can be obtained.

12 Claims, 4 Drawing Sheets

BEFORE HEAT TREATMENT

AFTER HEAT TREATMENT

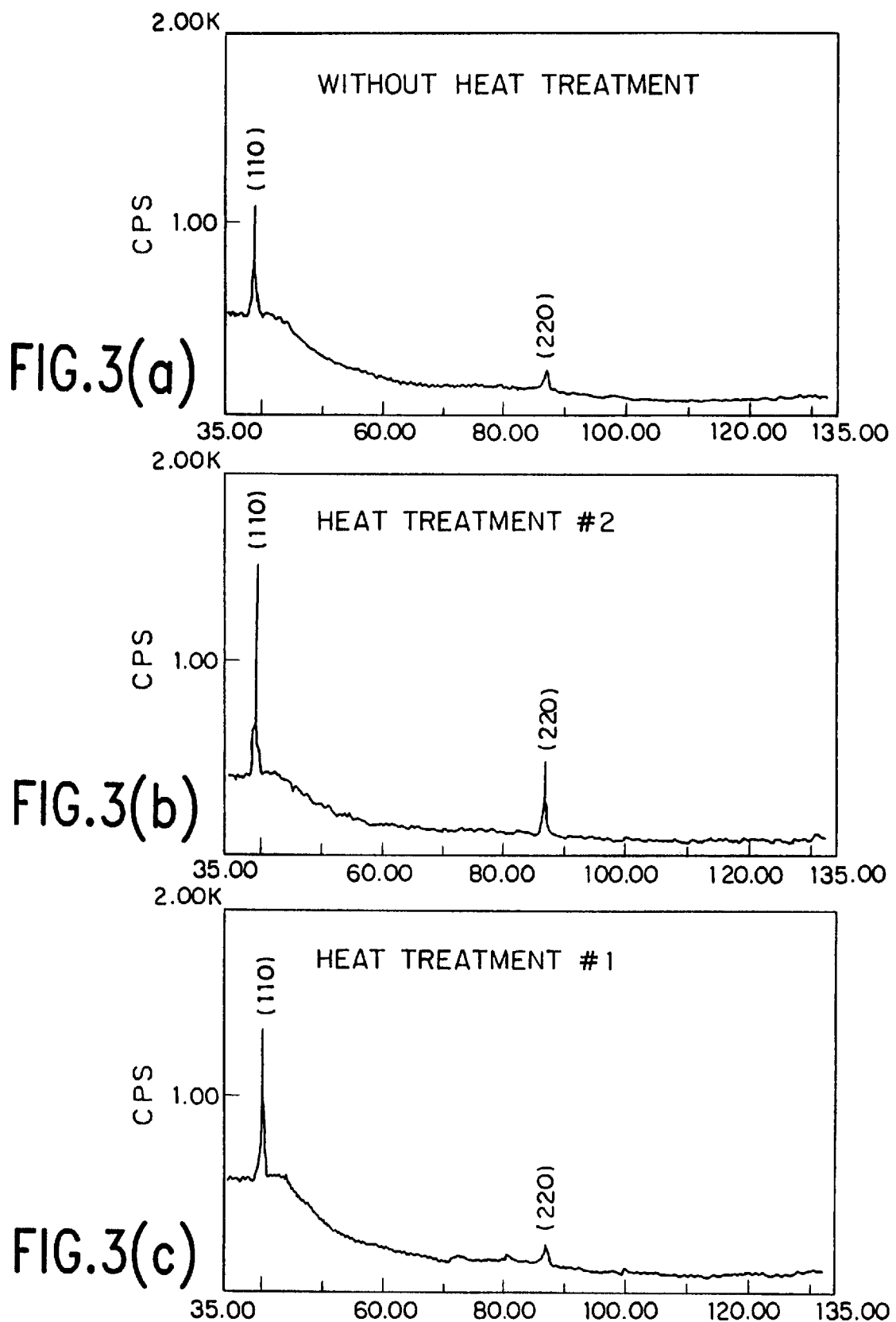

WITHOUT HEAT TREATMENT

HEAT TREATMENT

METALLIC MATERIAL MADE FROM TUNGSTEN OR MOLYBDENUM, METHOD OF PRODUCING THE METALLIC MATERIAL, AND SECONDARY PRODUCT MATERIAL USING THE METALLIC MATERIAL

FIELD OF THE INVENTION

The present invention relates to a metallic material made from tungsten or molybdenum, a method of producing the metallic material, and a secondary product material using the metallic material, and a technology for improving the quality of the metallic materials.

DESCRIPTION OF THE RELATED ART

A method of producing a primary product of tungsten or molybdenum commonly available on market is as follows. From the raw ores of both materials, powders are refined by a refining process. After pressing the powders to solidify to some extent, an ingot is obtained by the temporarily sintering and sintering processes. Since 10% or more empty holes are contained inside the ingot, in particular at the grain boundary, it has a fragile property as a metallic material due to the weakness in the grain boundary. In order to reduce the empty holes and the fragile property, the material is applied with a press process by a rotary swaging so as to extend the crystals in the direction of extending the material for the plasticity processing by about 60% by the processing ratio. Accordingly, the empty hole deficit inside the ingot can be eliminated, and the material tenacity can be obtained by extending the crystals. The material applied with the swaging process is called rod. In general, in this stage, the empty holes in a rod is about 6 to 7%.

By applying polishing finish, drawing, hammering, and the like to the rod material, a bar-like, linear, or plate-like primary product can be obtained. Since the crystal grains become fine and linear in the primary product stage, desired material strength and characteristics can be obtained.

A primary product of tungsten or molybdenum obtained by the above-mentioned production method is controlled to be needle-like crystals, however, 1 to 7% of the empty holes are included therein. Further, orientation of the crystal face is not sufficiently oriented.

Concerning the empty hole ratio, Japanese Patent Laid-open No. 5-140613 discloses the sintering density can be higher by applying the RIP (hot isostatic pressing) treatment on an ingot or a rod. However, the effect is limited only by the application after sintering but before machining, that is, before the stage of the primary product. If a primary product obtained by having tungsten and molybdenum in a bar-like or linear shape by machining is exposed to a hot temperature, that is, a temperature higher than the re-crystallization temperature (in general, a 40 to 50% temperature of the melting point (absolute temperature) of the metallic material), due to re-crystallization, the needle crystals have a shorter and thicker shape to loose the tenacity and the material becomes fragile, and thus it is problematic. Therefore, a material in the primary product stage obtained by applying machining finish on a rod material after sintering has never been applied with a heat treatment such as the HIP treatment conventionally.

SUMMARY OF THE INVENTION

In order to solve the above-mentioned problems, an object of the present invention is to obtain a metallic material with the improved quality while maintaining the needlelike crystal shape of a tungsten or molybdenum primary product, a method of producing the metallic material, and a secondary product material using the metallic material.

A first aspect of the present invention is a method of producing a metallic material which comprises the steps of sintering a powdery raw material selected from the group consisting of tungsten, tungsten alloy, molybdenum, and molybdenum alloy so as to obtain a rod material, applying machining process on the rod material so as to obtain a primary product of the metallic material, accommodating the same in a tightly sealable container, and applying heat at a temperature lower than the re-crystallization temperature of the metallic material under a non-oxidizing atmosphere with a pressure condition such that the volume of the metallic material contracts with the passage of time.

Since the first aspect of the present invention is a method of producing a metallic material which comprises the steps of sintering a powdery raw material selected from the group consisting of tungsten, tungsten alloy, molybdenum, and molybdenum alloy so as to obtain a rod material, applying machining process on the rod material so as to obtain a primary product of the metallic material, accommodating the same in a tightly sealable container, and applying heat at a temperature lower than the re-crystallization temperature of the metallic material under a non-oxidizing atmosphere with a pressure condition such that the volume of the metallic material contracts with the passage of time, the quality of the metallic material can be improved by a simple heat treatment without re-crystallization.

A second aspect of the present invention is a method of producing the metallic material which comprises the steps of sintering a powdery raw material selected from the group consisting of tungsten, tungsten alloy, molybdenum, and molybdenum alloy so as to obtain a rod material, applying machining process on the rod material so as to obtain a primary product of the metallic material, accommodating the same in a tightly sealable container, applying heat at 300 to 600° C. under a non-oxidizing atmosphere and applying a pressure at 200 atmospheric pressure or more.

Since the second aspect of the present invention is a method of producing the metallic material which comprises the steps of sintering a powdery raw material selected from the group consisting of tungsten, tungsten alloy, molybdenum, and molybdenum alloy so as to obtain a rod material, applying machining process on the rod material so as to obtain a primary product of the metallic material, accommodating the same in a tightly sealable container, applying heat at 300 to 600° C. under a non-oxidizing atmosphere and applying a pressure at 200 atmospheric pressure or more, the quality of the metallic material can be improved by a simple heat treatment without re-crystallization.

A third aspect of the present invention is a metallic material obtained by the above method and made from tungsten, tungsten alloy, molybdenum or molybdenum alloy, with 90% or more of a crystal orientation in the (110) plane.

Since the third aspect of the present invention is the metallic material obtained by the above method and made form tungsten, tungsten alloy, molybdenum or molybdenum alloy, with 90% or more of a crystal orientation in the (110) plane, a homogeneous material with an oriented crystal orientation, in particular, the radiation characteristic of electrons can be improved.

A fourth aspect of the present invention is a metallic material obtained by the above method and made from tungsten, tungsten alloy, molybdenum or molybdenum alloy, with 0.5% or less of a residual empty hole ratio, and 0.2 μm or less of a residual empty hole diameter.

Since the fourth aspect of the present invention is the metallic material obtained by the above method and made from tungsten, tungsten alloy, molybdenum, and molybdenum alloy, with 0.5% or less of a residual empty hole ratio, and 0.2 μm or less of a residual empty hole diameter, a homogeneous material with little empty hole defect can be obtained, in particular, the mechanical strength can be improved.

A fifth aspect of the present invention is the above method of producing the metallic material, wherein the primary product of the metallic material is accommodated in the tightly sealable container after being covered by a graphite material.

Since, in the fifth aspect of the present invention, the primary product of the metallic material is accommodated in the tightly sealable container after being covered by a graphite material, the temperature of the primary product can be homogeneous so that the improved homogeneous property can be obtained without unnecessary reaction with the tightly sealable container.

A sixth aspect of the present invention is the above method of producing the metallic material, wherein the primary product of the metallic material is mounted on a ceramic case accommodated it the tightly sealable container.

Since, in the sixth aspect of the present invention, the primary product of the metallic material is mounted on a ceramic case accommodated in the tightly sealable container, unnecessary reaction cannot be caused between the primary product and the tightly sealable container.

A seventh aspect of the present invention is a light source filament produced from a wire material comprising the above metallic material as the secondary product.

Since the light source filament is made from a homogeneous material, the so-called non-sag property can be improved so as to prolong the filament life.

An eighth aspect of the present invention is an electron discharging member produced from the above metallic material as the secondary product.

Since the electron discharging member is made from a homogeneous material, the radiation efficiency of the electrons can be improved so that the radiation distribution can be homogeneous.

A ninth aspect of the present invention is an electric contact member made from the above metallic material as the secondary product.

Since the electric contact member is made from a homogeneous material, an excellently smooth contact surface can be obtained.

A tenth aspect of the present invention is a target material for film formation made from the above metallic material as the secondary product.

Since the target material for film formation is made from a homogeneous material, a homogeneous target ratio can be obtained.

An eleventh aspect of the present invention is a wire material for electric discharge processing made from the above metallic material as the secondary product.

Since the wire material for electric discharge processing is made from a homogeneous material, homogeneous electric discharge can be achieved without the risk of disconnection.

A twelfth aspect of the present invention is a wire material for electric field generation made from the above metallic material as the secondary product.

Since the above wire material for electric field generation is made from a homogeneous material, the so-called non-sag property can be improved without deteriorating the tensile force.

BRIEF DESCRIPTION OF THE DRAWINGS

FIGS. 3A to 3C are graphs showing the result of the tungsten wire by the X-ray analysis.

DETAILED DESCRIPTION OF THE INVENTION

Figure 1:
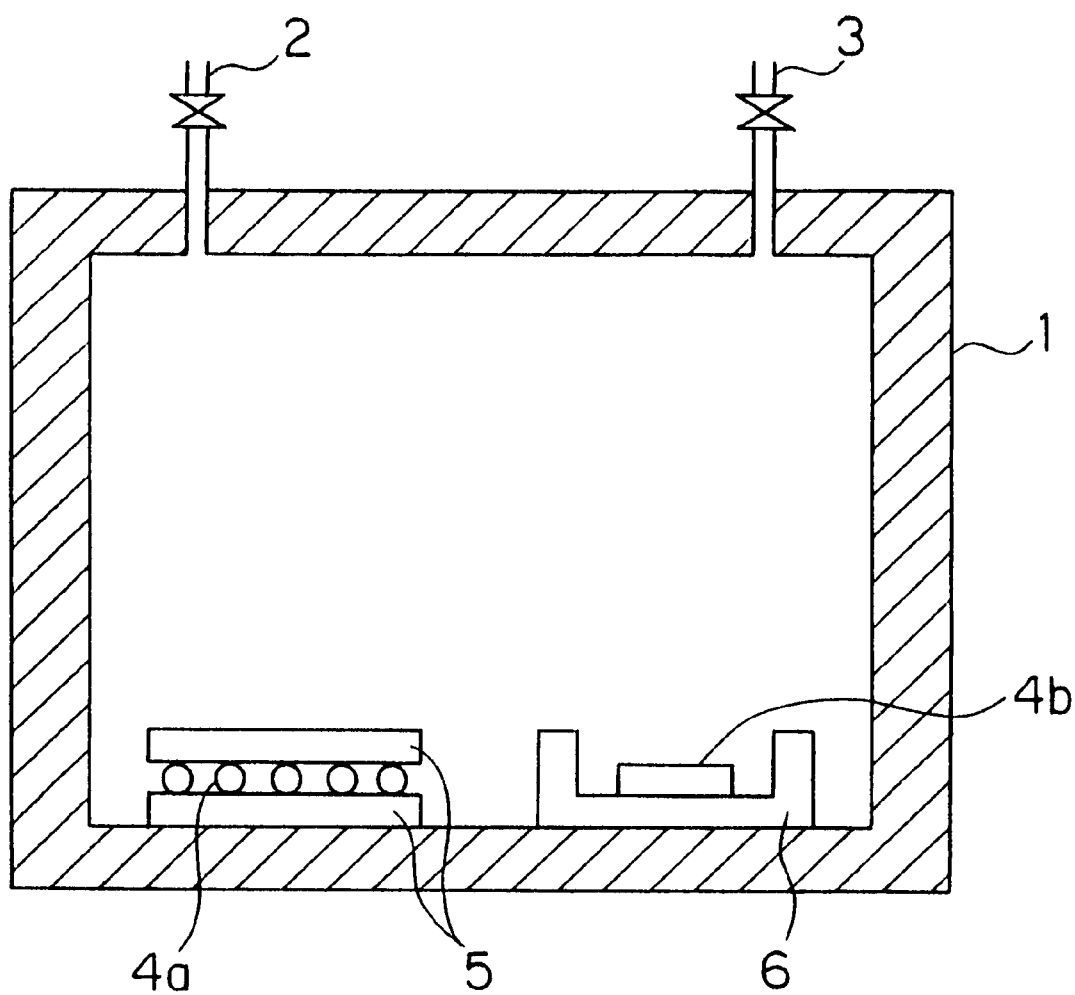
FIG. 1 is a diagram showing the schematic configuration of a heat treatment device which may be used in the present invention.

FIG. 1 is a diagram shoving the schematic configuration of a device for the heat treatment on the primary product consisting of tungsten or molybdenum. In the figure, numeral 1 represents a container for applying pressure (gas chamber) as the tightly sealable container comprising a heating means (not illustrated). 2 represents a gas discharging opening for discharging a gas inside the container 1, and 3 represents a gas introducing opening for introducing an Ar gas for applying pressure inside the container 1.

4a and 4b are metals to be treated, made from a primary product of tungsten or molybdenum. 4a has a linear shape and 4b has a plate-like shape. 5 is a graphite material provided inside the container 1 so as to cover the metal 4a to be treated for preventing unnecessary reaction between the metal and the container 1 and homogenize the temperature distribution of the metal. 6 is a ceramic ($Al_2O_3$) case provided in the container 1 for placing the metal 4b to be treated for preventing unnecessary reaction between the metal and the container 1.

The linear metal 4a and the plate-like metal 4b can be placed in any manner as long as the reaction with the container 1 can be prevented.

A heat treatment process of the present invention is conducted at a comparatively low temperature as later described so that the crystal shape of the material torture cannot be changed drastically. Therefore, the metals 4a and 4b shown in FIG. 1 should not necessarily be the material as itself as the primary product, but can be one processed in the shape of a finished product as the secondary product as later described.

Table 1 represents a first embodiment of the present invention, showing the heat treatment conditions for eliminating the internal empty holes of a 0.25 mm diameter tungsten wire.

TABLE 1

Heat treatment conditions for a tungsten wire

| Heat treatment condition | Treating temperature (° C.) | Pressure force (atm. pressure) | Retention time (hour) |
|---|---|---|---|
| #1 | 500 | 300 | 1 |
| #2 | 500 | 1000 | 1 |

In general, for eliminating the empty holes, it is considered that a temperature higher than the re-crystallization temperature of tungsten (1000 to 1300° C.) and a pressure higher than 1000 atmospheric pressure need to be included in the heat treatment conditions. However, in the present invention, the heat treatment temperature is set at 500° C. and the pressure force is set at, for example, 300 and 1000 atmospheric pressure while retaining the tungsten material in an Ar gas atmosphere in order to restrain the deformation of the needle-like crystals of the tungsten by the re-crystallization. These conditions are aimed at eliminating the empty hole defect concentrated at the grain boundary, diffusing atoms in the vicinity of the grain boundary which have a high chemical potential energy state, at a comparatively low temperature lower than the re-crystallization temperature of tungsten. Further, by applying pressure under a pressure condition such that the volume contracts with the passage of time, the empty hole defect in the vicinity of the crystal grain boundary can be finer or destroyed so that the crystal grain boundary can be reinforced.

Figure 2A:
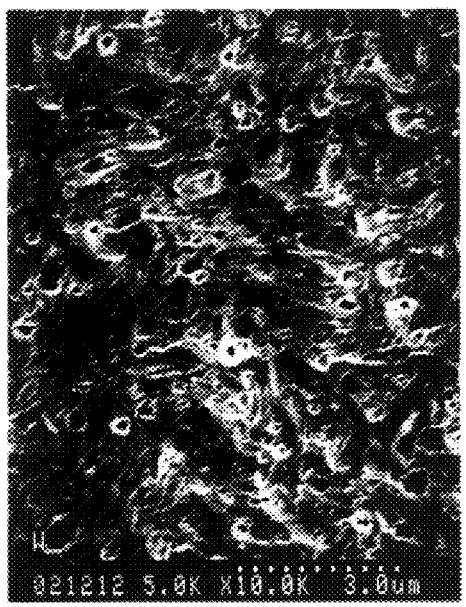
FIGS. 2A and 2B are photographs showing the cross-section of a tungsten wire taken by the SEM.
Figure 2B:
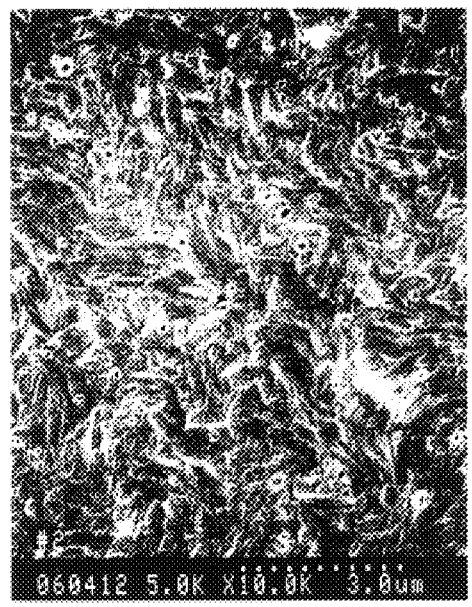

FIGS. 2A and 2B shows a cross-section (10000 magnification) of a tungsten wire by SEM. FIG. 2A shows a state before applying a heat treatment, and FIG. 2B shows a state after applying the heat treatment (heat treatment condition #2). A large empty hole defect can be observed in the left center of the figure as pointed by the arrow before applying the heat treatment. Further, a large number of empty holes of the similar size can be observed. By the analysis by image processing, the empty hole defect was found to be about 10%.

On the other hand, after applying the heat treatment as shown in FIG. 2B, empty holes are extremely small and the number is small as shown by the arrow substantially in the center. As the result of a quantitative analysis, the residual empty hole ratio was about 0.5% or less, and the maximum residual empty hole diameter was about 0.2 $\mu$m.

According to the heat treatment of the present invention, it was also found that the tungsten wire diameter contracts by about 4 to 8% (0.25mm→0.23mm). Table 2 shows the comparison between a conventional tungsten wire and a tungsten wire applied with a heat treatment with the heat treatment conditions of Table 1 in terms of the mechanical strength.

TABLE 2

Comparison of the mechanical strength

| Heat treatment condition | Tensile strength (kgf/mm$^2$) | Elongation (%) | Young's modulus (kgf/mm$^2$) |
| --- | --- | --- | --- |
| #1 | 279 | 3.3 | 21000 |
| #2 | 282 | 3.1 | 24000 |
| Conventional | 260 | 3.9 | 20000 |

In the tungsten wire subjected to the heat treatment conditions of the present invention, although the elongation is slightly small, the tensile strength and the Young's modulus are improved with a smaller irregularity. As a result of the experiment with different heat treatment conditions, the treatment of the tungsten product was proved to be effective in the range shown in Table 3. As shown in Table 3, the empty holes inside the material cannot be eliminated only by heating, but by applying pressure continuously for a certain time at the time of the heat treatment.

TABLE 3

Heat treatment condition capable of improving the mechanical strength

| Temperature (° C.) | Pressure (atmospheric pressure) | Retention time (hr) |
| --- | --- | --- |
| 300–600 | 200–2000 | 0.5–5 |

That is, with less than 300° C. of a heating temperature, or less than 200 of an atmospheric pressure, the effect of the above-mentioned quality improvement cannot be achieved. On the other hand, if the heating temperature exceeds 600° C., undesired re-crystallization is generated. Although the pressure condition shown in Table 3 shows 2000 atmospheric pressure as the maximum value, this does not define the upper limit of the pressure in the present invention since it was determined by the pressure resistance condition of the container 1 used in the experiment. Therefore, concerning the retention tine condition shown in Table 3, with a pressure higher than that of shown in Table 3, the quality improvement effect can be realized with a further shorter retention time. The upper limit 5 hour of the retention time denotes the saturation of the effect.

The result of the XD (crystal structure analysis by the X-ray diffraction) of the cross-section perpendicular to the axial direction of a tungsten wire applied with a heat treatment shows that the crystal orientation is oriented in (110) in the axial direction. A primary product of tungsten inherently has a (110) crystal orientation in the direction the product is elongating by swaging processing, and the crystal orientation is dominating. It was found that by applying a heat treatment of the present invention, crystals with a different crystal orientation and metallic atoms randomly arranged in the vicinity of the crystal grain boundary existing small in number can be changed substantially 100% to crystals with the (110) orientation. In addition to eliminating the empty hole defect in the crystal grain boundary, this serves as a factor for improving the mechanical strength of tungsten, and improves various electric characteristics later described.

Concerning the crystal orientation change, it was found that the crystal orientation can be changed to (110) in even one applied with swaging processing as the stage before the primary product, with the ratio of the crystal elongation direction and the direction orthogonal thereto (aspect ratio of the needle-like texture) exceeding 5:1.

FIGS. 3A to 3C show measured values of the analysis result in the X-ray analysis. FIG. 3A shows one without the heat treatment, FIG. 3B shows one applied with the heat treatment (condition #2), and FIG. 3C shows one applied with the heat treatment (condition #1). The vertical axis represents the X ray strength, and the horizontal axis represents the radiation angle of the X ray. The angular positions corresponding to the (110) crystal face and the (220), which is parallel to the (110) and substantially equivalent thereto are shown as examples.

Table 4 shows measured values of the integrated intensity of the tungsten cross-section of the three samples.

TABLE 4

Integrated intensity of the tungsten cross-section

| Heat treatment condition | Face index | Integrated intensity (cps) |
|---|---|---|
| #1 | W (110) | 31467 |
|  | W (220) | 7188 |
| #2 | W (110) | 36872 |
|  | W (220) | 22925 |
| Without heat treatment | W (110) | 21767 |
|  | W (220) | 7389 |

From the results, it can be seen that the crystal orientation of the (110) face (including the (220) face) is remarkably increased.

Figure 4A:
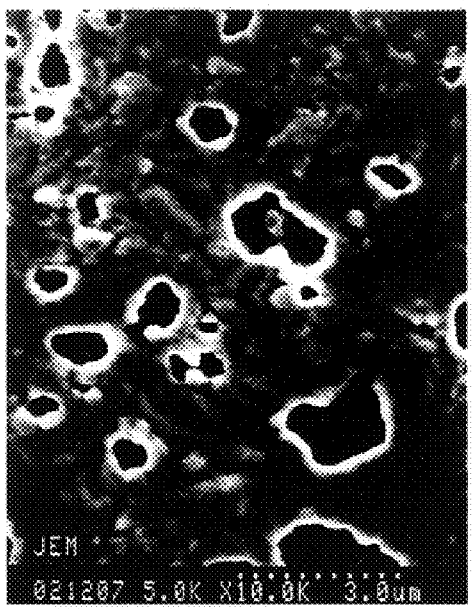
FIGS. 4A and 4B are photographs showing the surfaces of the corroded tungsten wire taken by the SEM.
Figure 4B:
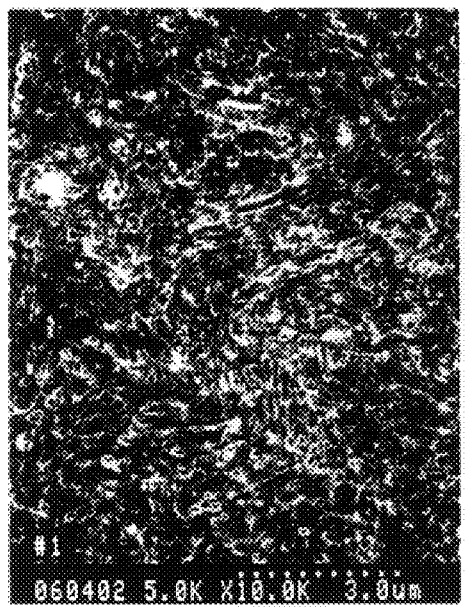

FIGS. 4A and 4B show the cross-section (10000 magnification) by the SEM for comparing the one with an oriented crystal face and one without the heat treatment. That is, the surface of the sales finished in a predetermined smooth face after exposed to an $H_2O_2$ liquid at 100° C. for 45 seconds was observed.

FIG. 4A is without the heat treatment. It can be observed that the parts other than the (110) face are extremely corroded since the surface crystal orientation is not sufficiently oriented.

On the other hand, since one shown in FIG. 4B applied with the heat treatment (condition #2) of the present invention is highly oriented in the (110) face, uneven corrosion cannot be observed.

By the analysis of the above-mentioned measured values, the crystal orientation in the (110) face is less than 80 to 90% in the conventional product, but more than 99% in one applied with the heat treatment (condition #2) of the present invention. It is considered that at least 90% crystal orientation can be obtained in the range of the heat treatment conditions of the present invention.

As mentioned above, according to the present invention, tungsten or molybdenum with a 90% or more crystal orientation in the (110) face can be obtained. Furthermore, tungsten or molybdenum with 0.5% or less residual empty hole ratio and a 0.2 μm or less residual empty hole diameter can be obtained. Various secondary products effectively utilizing the former feature will be explained.

That is, since the crystal orientation is oriented in the (110) face, the radiation characteristic of electrons can be improved. Since various crystal orientations exist in the cross-section in the axial direction in a conventional tungsten material, a homogeneous electron radiation cannot be achieved due to the different radiation characteristics of electrons in the crystal orientations. Since the radiation efficiency of electrons can be improved so as to obtain a homogeneous distribution by using tungsten or molybdenum, applied with a heat treatment of the present invention, application in various kinds of electron discharging member can be considered. For example, by applying the same to a filament of an electron microscope or a probe (field emission type), an electron microscope having a further higher resolution ability with respect to a conventional one can be obtained. similarly, since the spot diameter of the electron beam can be smaller by applying the above-mentioned to an electron gun electrode part, a cathode ray tube capable of obtaining a further vivid image can be provided.

Furthermore, by mounting tungsten or molybdenum applied with a heat treatment of the present invention to a film forming device as the target material for sputtering, a device capable of obtaining a homogeneous sputter rate and achieving a further homogeneous film formation can be obtained. This is effective for downsizing of the pattern rule of a semiconductor.

Since the crystal orientation change according to the re-crystallization of a filament by the conduction heat can be prevented by using the above-mentioned material to a filament of a illuminating bulbs (electric lamps, fluorescent lamps, and the like), the property without sagging of a filament, that is, the so-called non-sag property can be improved so that the filament life, that is, the illuminating bulbs can be prolonged.

Moreover, since the crystal orientation is oriented, the polishing rate difference cannot be generated due to the crystal orientation difference even if mechanical or chemical polishing is conducted, an extremely smooth surface can be obtained. Therefore, by producing an electric contact probe with the above-mentioned material, since the surface coarseness in the contact surface can be extremely small, generation of adhered substances can be restrained, and thus the probe life can be prolonged.

Further, since the above-mentioned material is treated at a comparatively low temperature, metallic atoms having a crystal orientation other than the (110) move in the vicinity of the crystal grain boundary so as to be oriented according to the dominating crystal orientation (110) by the pressure effect, the crystal orientation change according to the re-crystallization of the tungsten wire by the conduction heat can be prevented. Therefore, the property without sagging of a tungsten wire, that is, the so-called non-sag property can be improved so that the tensile force cannot be declined even if a high tensile force (about 20 kqf/mm$^2$ or more) is applied over a long time. Moreover, since the oxidation stability of the tungsten wire surface can also be improved, it can be used as a narrow wire for generating an electric field. For example, it can be used as a wire for charging the drum in a copier or a printer. A wire made from the above-mentioned material has a high durability, and does not require a platinum (Pt) coating on the surface conventionally required.

Since a defect hardly exists inside the material, the mechanical strength is stable so that by applying to a wire for discharge processing for discharging while applying a certain tensile force, stable discharging processing can be conducted without the risk of disconnection.

Although the case of applying to tungsten and molybdenum has been explained so far, the present invention can also be applied to a metallic material comprising a tungsten alloy or a molybdenum ally containing a several percent of Re for improving the wear resistance of the material with the same effects.

What is claimed is:

1. A method for producing a metallic material comprising the steps of:

sintering a powdery raw material selected from the group consisting of tungsten, tungsten alloy, molybdenum and molybdenum alloy so as to obtain a rod material;

applying machining process on the rod material so as to obtain a primary product of the metallic material;

accommodating the same in a tightly sealable container; and applying heat at a temperature lower than the re-crystallization temperature of the metallic material under a non-oxidizing atmosphere with a pressure condition such that the volume of the metallic material contracts with the passage of time.

2. The method of claim 1, comprising the steps of:

sintering a powdery raw material selected from the group consisting of tungsten, tungsten alloy, molybdenum and molybdenum alloy so as to obtain a rod material;

applying machining process on the rod material so as to obtain a primary product of the metallic material;

accommodating the same in a tightly sealable container; and applying heat at 300 to 600° C. under a non-oxidizing atmosphere and applying a pressure at 200 atmospheric pressure or more.

3. A metallic material made from tungsten, tungsten alloy, molybdenum or molybdenum alloy with 90% or more of a crystal orientation in the (110) plane, and obtained by the method of claim 1.

4. A metallic material made from tungsten, tungsten alloy, molybdenum or molybdenum alloy with 0.5% or less of a residual empty hole ratio and 0.2 μm or less of a residual empty hole diameter, and obtained by the method of claim 1.

5. The method of claim 1, wherein the primary product of the metallic material is accommodated in the tightly sealable container after being covered by a graphite material.

6. The method of claim 1, wherein the primary product of the metallic material is mounted on a ceramic case accommodated in the tightly sealable container.

7. A light source filament produced from a wire material comprising the metallic material obtained by the method of claim 1 as the secondary product.

8. An electron discharging member produced from the metallic material obtained by the method of claim 1 as the secondary product.

9. An electric contact member made from the metallic material obtained by the method of claim 1 as the secondary product.

10. A target material for film formation made from the metallic material obtained by the method of claim 1 as the secondary product.

11. A wire material for electric discharge processing made from the metallic material obtained by the method of claim 1 as the secondary product.

12. A wire material for electric field generation made from the metallic material obtained by the method of claim 1 as the secondary product.

* * * * *